United States Patent
Wiese et al.

(10) Patent No.: US 7,223,964 B2
(45) Date of Patent: May 29, 2007

(54) INTEGRATION OF ELECTRONIC DATA STORAGE INTO A TELECOMMUNICATIONS COMPONENT

(75) Inventors: Lynn Karl Wiese, Santa Clara, CA (US); Matthew Glenn Peters, Menlo Park, CA (US); Jo S. Major, Jr., Cupertino, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 326 days.

(21) Appl. No.: 10/449,763

(22) Filed: May 30, 2003

(65) Prior Publication Data

US 2003/0234353 A1 Dec. 25, 2003

Related U.S. Application Data

(60) Provisional application No. 60/384,165, filed on May 31, 2002.

(51) Int. Cl.
*H01J 5/02* (2006.01)
*H01J 40/14* (2006.01)

(52) U.S. Cl. .................. 250/239; 250/214 R
(58) Field of Classification Search ............ 250/239, 250/214 R
See application file for complete search history.

(56) References Cited

U.S. PATENT DOCUMENTS 5,278,404 A  1/1994  Yeates .................. 250/214 C
6,771,169 B1 *  8/2004  Kaminski et al. ............ 340/442
2003/0133479 A1 *  7/2003  Morikawa et al. ............ 372/36

* cited by examiner

Primary Examiner—Georgia Epps
Assistant Examiner—Kevin Wyatt
(74) Attorney, Agent, or Firm—Allen, Dyer, Doppelt, Milbrath & Gilchrist, P.A.

(57) ABSTRACT

A storage information system is disclosed for keeping archival information on the individual active optoelectronic components that are used in telecommunication equipment. The system involves enclosing a nonvolatile memory chip inside the hermetic package of the active optoelectronic component. A memory chip is used to keep the relevant information about the active optoelectronic component such as serial number, part number and specifications. Sensors can also be included inside the hermetic package to monitor the operating conditions of the optoelectronic component. The information system is capable of storing information that is relevant to the component reliability such as: hours of operation, maximum current or voltage, and maximum temperature. The information storage system has the advantage that the archived information is intimately associated with the optoelectronic component thereby lessening the likelihood that information is lost or tampered with. The information system eliminates need for keeping paper records on individual optoelectronic components. It also provides a means for determining if the optoelectronic component was operated outside its specified operating limits. The users of optoelectronic components can also access the information system as needed for the purposes of repair or maintenance of telecommunications equipment.

7 Claims, 2 Drawing Sheets

INTEGRATION OF ELECTRONIC DATA STORAGE INTO A TELECOMMUNICATIONS COMPONENT

RELATED APPLICATIONS PRIORITY DATA

This application claims the benefit of U.S. Provisional Patent Application No. 60/384,165, filed May 31, 2002.

FIELD OF THE INVENTION

The present invention relates to optoelectronic components and more particularly to storing records of information on or within individual components.

BACKGROUND OF THE INVENTION

Telecommunication equipment uses a variety of different components. Keeping track of these individual components through the various stages of assembly and test of the equipment is a time-consuming and expensive process. Furthermore, after delivery of the equipment to the customer, there is often a need to provide information on or with the components to the customer. Component information is also needed in the repair and maintenance of the equipment in the telecommunications network. The provision, handling and storage of such component information is time consuming and costly both to the telecommunications equipment manufacturer and the customer.

The component information is usually provided in paper or electronic form and is linked to the component by means of a serial number marked on the component or on its container.

The problems associated with keeping track of individual telecommunication components are exacerbated in the case of active optoelectronic components, which are devices that are used for the generation, detection, and/or modulation of light. For example, active optoelectronic components that are used in terrestrial and/or undersea fiber optic communication are required to have high-reliability levels or low-failure rates; a typical failure rate can be less than 1000 per $10^9$ device hours of operation. To insure such low-failure rates requires stringent control over the conditions under which the device was manufactured as well as control over the operating conditions that the device experiences. Thus the assurance of the reliability performance of optoelectronic components places a unique requirement on the component information needed. For example, there may be a need to have records of the operating conditions of a component during its functional lifetime.

When being used, typical active optoelectronic devices are restricted to operate within the bounds of a predetermined set of operational parameters. The bounds for this set of operational parameters are usually expressed as an absolute maximum and/or minimum—temperature, current, voltage etc. or any combination of these or other parameters. Thus there is an envelope of operational parameters within which the optoelectronic device can be safely used. Operation of the optoelectronic device outside the bounds of the envelope can result in catastrophic failure or it can have a harmful effect on the long-term reliability of the device. That is, operating the device outside the envelope of operational parameters, may lead to degradation in device, which is not apparent on return to the normal operating conditions of the device. Nevertheless, the life-time or reliability of the device may be shortened or decreased. Thus it is advantageous to keep a record of the operating conditions of the optoelectronic device for the purposes of identifying potentially lower reliability devices and as a means for guaranteeing the device reliability. It is also advantageous in the case of device warranties to have a record of the operating conditions in order know whether the device was used properly within its operational parameter limits. Therefore it is desired that the security of the recorded information be ensured.

Since the adverse operating conditions can occur even during the manufacture of the optoelectronic component, it is desirable to initiate the recording of the operating conditions as soon as possible in the manufacturing process. Currently, such information is recorded and stored on paper or in computer memory as for example the database of a manufacturing execution system. However, due to the complexities of the manufacturing processes and its supporting data systems, it may not be practical to keep such a record of the operating parameters. This is particularly true if the optoelectronic part is small which precludes simple methods for marking the part with an identification mark.

When the optoelectronic component is shipped to the customer for installation into a larger assembly, additional problems occur. Firstly there is no assurance that the component operational conditions will be recorded and stored by the customer. Often, the customer will ship the assembly containing the component to third party thereby making the keeping of a record of operational conditions of the component even more difficult. It is known that the customer will often resist requirements placed on them to maintain such records because of extra costs and inconvenience incurred. The primary benefit of such records is for the manufacturer who wishes to provide guarantees of reliability for their devices. Thus manufacturers would prefer a means for recording the relevant operational information and a means for storing this information that is completely transparent to the customer. That is, no requirements are placed on the customer to collect and keep information on the operational conditions of the optoelectronic device.

It is an object of this invention to provide a means for recording and storing optoelectronic component information and the operating conditions and parameters of an optoelectronic component that are relevant to component reliability.

It is a further object of this invention that the means for recording and storing the information is secure, is accessible to be read by the customer, and does not place an extra burden on the customer to monitor the optoelectronic operating conditions and to store the collected information.

SUMMARY OF INVENTION

In accordance with the invention a system for the archival storage of information about an active optoelectronic component is provided that overcomes the current problems associated with keeping track of individual components in telecommunication equipment. The storage system of the present invention is capable of keeping records about the individual optoelectronic component including such information as serial number, part number, model type, specifications, operating information, and individual component performance data. The present invention is particularly applicable to active optoelectronic components such as laser diodes, optical modulators, optical amplifiers, and photodetectors.

In accordance with the invention, the information storage system is also provided with a means for recording the operating conditions of an optoelectronic component during its functional lifetime thereby eliminating the need for the user of the optoelectronic component to create and keep such records. Thus the information storage system of the present invention is capable of keeping records on the operating conditions of individual active optoelectronic components, which may include such information as hours of operation, maximum current, maximum voltage, maximum temperature.

In accordance with a preferred embodiment of the invention, the information storage system is an optoelectronic device that contains a nonvolatile memory chip inside the same hermetic package that encloses the active optoelectronic component. Thus in the present invention, the means used for storage of the component information is closely associated physically with the active optoelectronic component in the same hermetic package thereby ensuring the security of the information since the information is stored with the component and cannot be accessed physically except by breaking the hermetic seal.

In accordance with another embodiment of the invention, the information storage system uses sensors for monitoring the operating and environmental conditions of the active optoelectronic component and the sensors are located inside the same hermetic package of the optoelectronic device that contains the memory chip and the active optoelectronic component. Thus in the present invention, the sensors are closely associated physically with the optoelectronic component thereby ensuring that the environmental conditions that are being monitored are similar to those being experienced by the active optoelectronic component. This means for monitoring the operating and environmental conditions of the active optoelectronic component in the present invention has the additional benefit that the user of the component does not need to be concerned about performing these functions when using the active optoelectronic component.

In accordance with the invention, the information storage system provides a means inside the hermetic package for receiving information about the operating and/or environmental conditions experienced by the active optoelectronic component and storing this information in the nonvolatile memory chip. The present invention also provides means for accessing the memory chip inside the package from outside the package for the purpose entering component information data such as serial number, part number, component specifications and performance data and storing it permanently in the nonvolatile memory chip. In addition, this access means of this present invention permits reading the information contents of the memory chip from outside the hermetic package thus enabling a user of component to have ready access to the information needed in the maintenance and repair of telecommunication equipment. The preferred method of access is electrical by means of conducting feed-throughs into the hermetic package. In order to improve the security of the information contained on the chip, the present invention may use encryption techniques for the transfer of data to and from the memory storage means inside the hermetic package.

BRIEF DESCRIPTION OF THE DRAWINGS

The invention will be described in greater detail with reference to the accompanying drawings, which represent preferred embodiments thereof, wherein.

DETAILED DESCRIPTION

Figure 1:
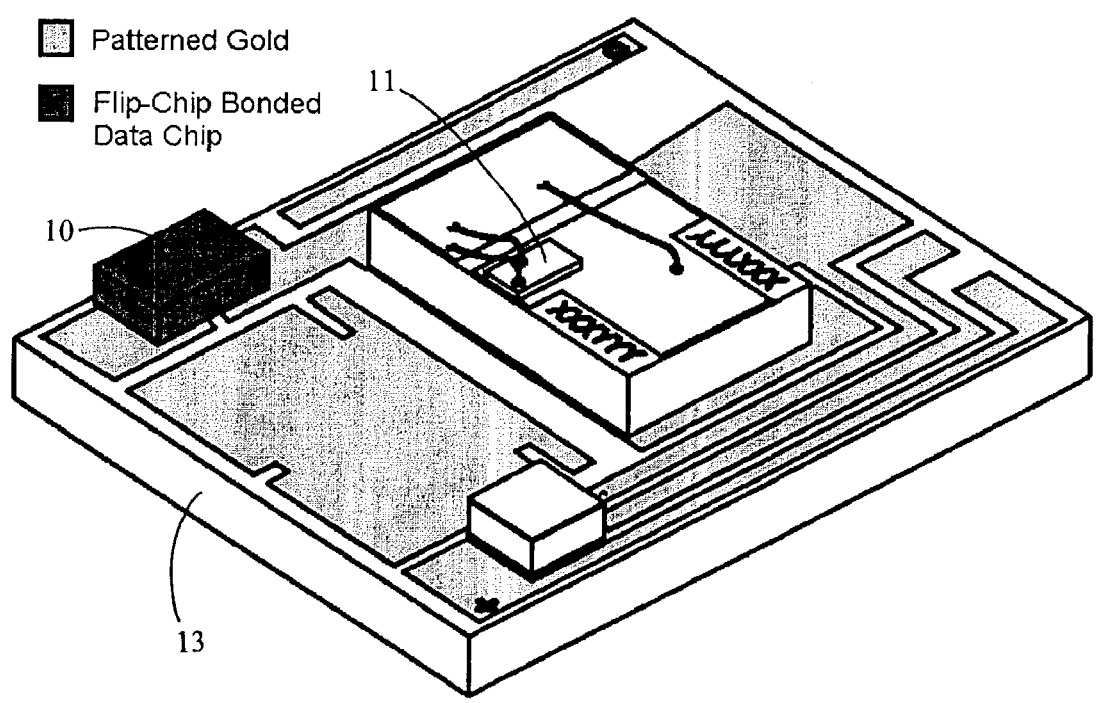
FIG. 1 is a schematic diagram showing the integration of a memory chip on a submount platform of a laser pump module.

To obtain a record of the operating conditions of an optoelectronic device in a hermetic package during its functional lifetime, the relevant operating parameters need to be monitored and recorded. The most straightforward approach would be to monitor the relevant operating parameters external to the hermetic package and to store them electronically in a memory chip in the optical subsystem that contains the optoelectronic component. There is considerable prior art teaching the use of a memory chip on a PCB associated with a laser diode for the purpose of recording similar type information on the laser diode.

U.S. Pat. No. 5,278,404 in the name of Yeates discloses an optical sub-system with an embedded micro-controller that has memory storage. The memory in the micro-controller is used to store the optimum operating parameters of the optoelectronic component under different environmental conditions. Thus the micro-controller has a means for optimizing the operation of the optoelectronic device to different environmental conditions. Although the memory in this micro-controller is used for a different purpose, it could also be used to record and store the operating parameters of the optoelectronic component during its functional lifetime. Such a solution to problem of recording and storing the required information on an optoelectronic component is unsatisfactory in that the security of the information is not ensured and it requires the involvement of the customer.

To overcome these problems, it is proposed to include a nonvolatile memory chip within the hermetic package of the optoelectronic component. This memory would be used for storing manufacturing data, product data, and the recording of the operational and performance history of the optoelectronic component during its functional lifetime. Sensors may also be included in the package to provide a record of the environmental conditions experienced by the laser diode. Although this invention increases the complexity of the laser diode hermetic package, there are many benefits that are obtained by including the memory inside the hermetic package rather then outside the hermetic package.

In the case of electronic memory that is external to the hermetic package, the designer and manufacturer of the subsystem that includes the hermetically sealed optoelectronic package needs to incorporate in the design of the subsystem monitoring, electronic circuitry and electronic memory to record and store the required information. It is preferable, however, that the customer does not have to be concerned with this aspect of the operation of the optoelectronic component. Furthermore the security of the component information is not ensured when the memory is external to the hermetic package. Although the memory chip is associated with the optoelectronic component in that they are in the same subsystem, they are still separate components. The memory chip could be removed from the system and be replaced with another with no apparent evidence that such an exchange was made. However, with the memory chip inside the hermetic package, this security problem is eliminated.

Another problem with performing the recording and monitoring function external to the optoelectronic hermetic package is that some parameters, such as temperature, the value measured depends on whether the sensor is inside the package or outside the package. A sensor inside the hermetic package will measure a temperature different from one outside the package. What is relevant as far as device reliability is concerned, is the temperature inside the package. Thus it is desirable to place the sensors as close as possible to the optoelectronic component being monitored. Furthermore, for some parameters, the sensor must be inside the package so that it is in the same atmospheric conditions being experienced by the optoelectronic component. The reliability of an optoelectronic device can be affected by the presence of certain gases or organics in the atmosphere surrounding the component. The detection of these materials requires the sensor to be placed inside the same package as the optoelectronic component.

Finally, a memory chip that is inside hermetic package is associated physically with the optoelectronic component thereby ensuring the security of the recorded information. That is the memory cannot be removed from the package without damaging the hermetic seal. The contents of the memory however, are still available for access by the customer when needed, but otherwise the customer does not have to be concerned with the collecting of the information to be stored in the memory.

The invention is now illustrated more fully in terms of a pump laser diode being the optoelectronic component of interest.

Figure 2:
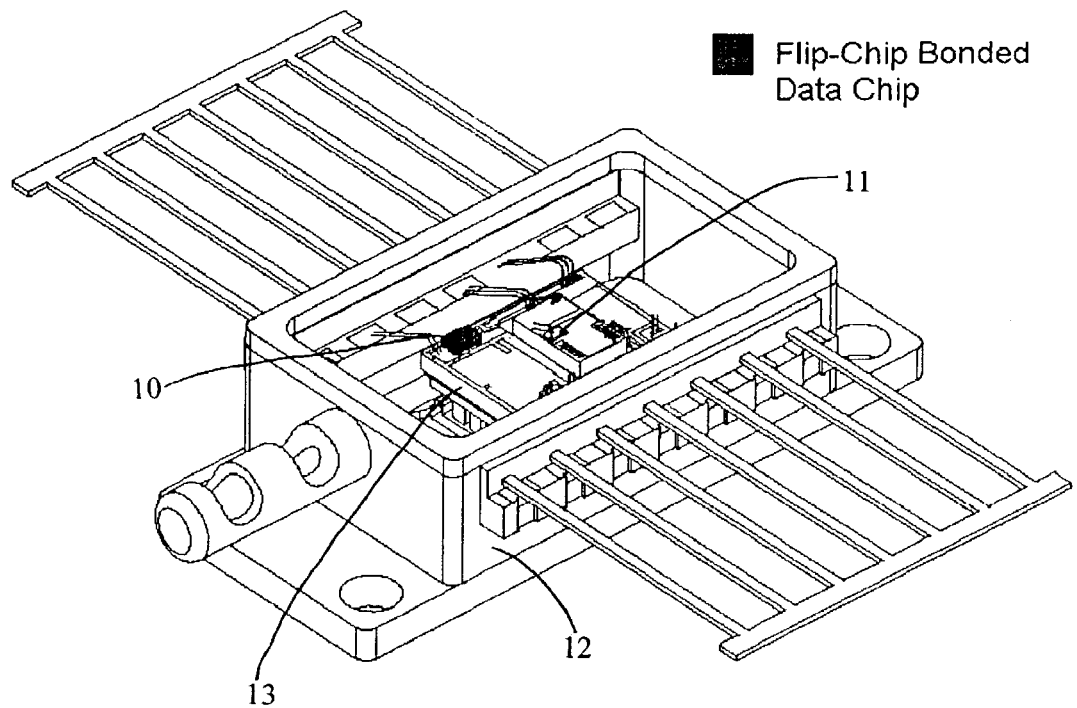
FIG. 2 is a schematic diagram showing the placement of the submount platform in a hermetically sealed butterfly package.

FIG. 1 and FIG. 2 show an embodiment of the invention in which a sensor/memory chip 10 is provided with a pump laser diode 11 in a hermetic butterfly package 12. The sensor/memory chip is mounted on the same platform 13 as the pump laser, so as to experience as nearly as possible, the same temperature and atmospheric conditions as the laser chip. The sensor/memory chip is a silicon ASIC containing sensing electronics for current and temperature. The temperature sensing may be a thermistor integrated with the sensor/memory chip or it may be a separate chip within the package. The sensor/memory chip also contains a current sensor connected in series with the laser diode to measure the laser current and an analog-to-digital converter to convert the measurements of temperature and/or current into digital form.

The memory chip 10 can be a data chip that is commercially available. The invention, however, is not limited to a particular type of electronic memory. The memory should be nonvolatile so the records of extremes of temperature and current under operational conditions are stored permanently. It may also be desirable to store the data in encrypted form. There is an additional requirement that the memory chip have a serial electronic interface to permit interrogation and/or means for altering the contents of the memory. Although the preferred method of storing and communicating with the storage means is electrical, it is apparent that other storage and communications means such as optical are with in the scope of the present invention. The key considerations with respect to the memory means are the memory chip size and the number of pins required for communication. It is preferable the chip be physically small so that it can fit in the hermetic package. The connection between the sensor/memory chip and the outside world is made through one of the pins of the hermetic package that is not normally used. The preferred configuration for communications to the outside is one data pin and one ground pin.

Figure 3:
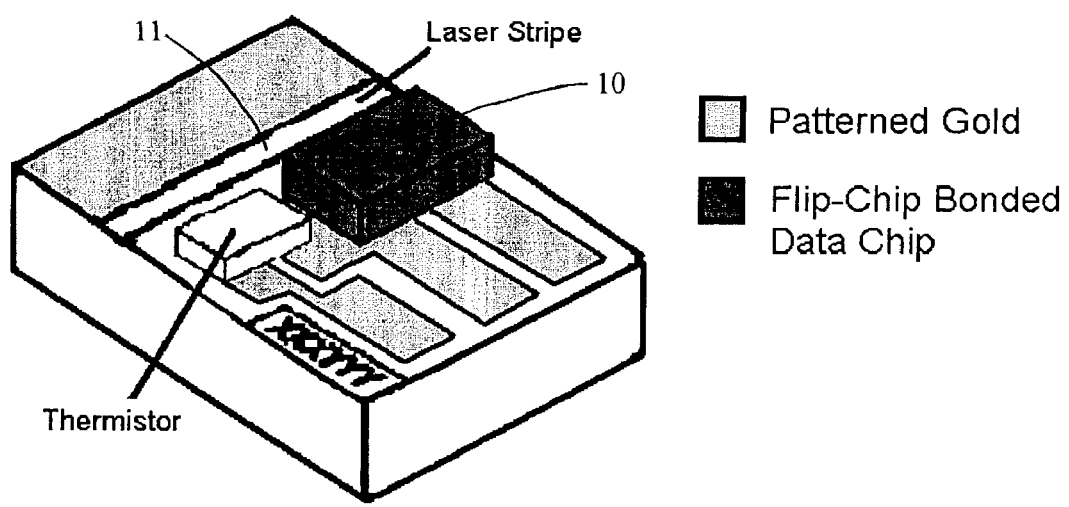
FIG. 3 is another embodiment of the invention with the memory chip bonded to the chip as the laser diode.

FIG. 3 shows another embodiment of the invention. In this case the memory chip 10 is integrated with laser diode on the same substrate. The functions of the memory chip are similar to that in the first embodiment. The advantage of this embodiment is that a smaller hermetic package is possible.

The invention has been described in terms of a pump laser diode, but it should be apparent to one skilled in the art that the invention also applies to other active optoelectronic components such as semiconductor optical amplifiers, optical modulators, and photodetectors.

The types of data information that are stored in the memory can also be very diverse. For example, depending on the specific type of optoelectronic device, storage of information related to: current supplied to device, voltages applied to device, temperature experienced by the device, optical intensity incident on and/or emitted by the device, elapsed hours of operation, manufacturing part codes, product codes, etc. are all considered with in the scope of the invention.

The invention has also been described in terms of a hermetically sealed package, which in the normal sense has the meaning of a package, which is airtight. That is air or moisture on the outside of the package cannot penetrate into the package. There are other forms of packaging, which are considered non-hermetic but would still lie with in the scope of the invention. An example of such packaging is an optoelectronic component and a memory chip encased with in a molded plastic package. In terms of the invention, a hermetic package is deemed to include any package in which the memory chip and the optoelectronic are enclosed together in a package and sealed in such a manner that separation of the memory chip from the optoelectronic component results in physical damage to the package or the seal.

What is claimed is:

1. An optoelectronic device, comprising:
    a single active optoelectronic component;
    a package enclosing the single active optoelectronic component;
    a storage system inside the package, the storage system comprising:
        means for recording the operating conditions of the single active optoelectronic component, and;
        a nonvolatile memory for keeping component information and operating conditions information solely on the single active optoelectronic component physically connected thereto in a manner to prevent the separation of the nonvolatile memory from the single active optoelectronic component;
    electronic circuitry connecting the nonvolatile memory and the single active optoelectronic component for transferring the information on the operating conditions of the single active optoelectronic component to the nonvolatile memory; and
    at least one connection through the package linking the nonvolatile memory to the outside of the package in order to provide means for reading or writing the component information into or out of the nonvolatile memory:
    wherein the package is sealed in such a manner that separation of said non-volatile memory from said single active optoelectronic component inside said package results in physical damage to said package or a seal therefor.

2. An optoelectronic device as defined in claim 1, further comprising:
    at least one sensor inside the package for monitoring the environmental conditions related to the single active optoelectronic component and, electronic circuitry inside the package for connecting the sensor to the nonvolatile memory in order to transfer information on the environmental conditions of the single active optoelectronic component to the nonvolatile memory.

3. An optoelectronic device as defined as in claim 1 wherein the connection through the package is at least one electrical conducting hermetic feed-through.

4. An optoelectronic device as defined in claim 1, wherein the active optoelectronic component is one of: a laser diode, a semiconductor optical amplifier, an optical modulator, and an optical detector.

5. An optoelectronic device as defined in claim 1, wherein the operating conditions information is at least one of: current, voltage, optical power, and hours of operation.

6. An optoelectronic device as defined in claim 1, wherein the component information is at least one of: serial number, part number, model number, active optoelectronic component specifications, and active optoelectronic component performance data.

7. An optoelectronic package as defined in claim 2 wherein the environmental conditions information is at least one of: temperature, pressure, shock, water, and ingredients of the atmosphere inside the package.

* * * * *